US010068787B2

(12) United States Patent
Abas

(10) Patent No.: US 10,068,787 B2
(45) Date of Patent: Sep. 4, 2018

(54) BOWING SEMICONDUCTOR WAFERS

(71) Applicant: SunPower Corporation, San Jose, CA (US)

(72) Inventor: Emmanuel Chua Abas, Santa Rosa (PH)

(73) Assignee: SUNPOWER CORPORATION, San Jose, CA (US)

(*) Notice: Subject to any disclaimer, the term of this patent is extended or adjusted under 35 U.S.C. 154(b) by 0 days.

(21) Appl. No.: 15/395,955

(22) Filed: Dec. 30, 2016

(65) Prior Publication Data
US 2018/0190525 A1 Jul. 5, 2018

(51) Int. Cl.
A47G 19/08 (2006.01)
H01L 21/673 (2006.01)
H01L 31/0368 (2006.01)

(52) U.S. Cl.
CPC .. *H01L 21/67316* (2013.01); *H01L 21/67313* (2013.01); *H01L 21/67326* (2013.01); *H01L 31/0368* (2013.01)

(58) Field of Classification Search
CPC ........... H01L 21/67316; H01L 31/0368; H01L 21/67313; H01L 21/67326; H01L 21/6733; H01L 21/673; H01L 21/68771; H01L 21/67346; H01L 21/67363; H01L 21/67383; H01L 21/6735; H01L 21/68757; H01L 21/68735; A47B 65/10; A47B 45/00; A47B 57/58; A47B 57/583; A47B 65/00; A47B 65/15; A47B 65/20; A47F 7/144; B25B 11/00; B25B 11/02

(Continued)

(56) References Cited

U.S. PATENT DOCUMENTS 3,889,815 A * 6/1975 Merle ............... A47F 7/02
206/454
3,949,891 A 4/1976 Butler et al.
(Continued)

FOREIGN PATENT DOCUMENTS

WO WO 2015/180798 A1 12/2015

OTHER PUBLICATIONS

Notification of Transmittal of the International Search Report and the Written Opinion of the International Searching Authority, or the Declaration for International Application No. PCT/US2017/067012 (dated Apr. 6, 2018).

*Primary Examiner* — Jennifer Eleanore Novosad
(74) *Attorney, Agent, or Firm* — Jenkins, Wilson, Taylor & Hunt, P.A.

(57) ABSTRACT

Methods for processing semiconductor wafers, methods for loading semiconductor wafers into wafer carriers, and semiconductor wafer carriers. The methods and wafer carriers can be used for increasing the rigidity of wafers, e.g., large and thin wafers, by intentionally bowing the wafers to an extent that does not break the wafers. In some examples, a method for processing semiconductor wafers includes loading each semiconductor wafer into a respective semiconductor wafer slot of a semiconductor wafer carrier, horizontally bowing each semiconductor wafer, and moving the semiconductor wafer carrier into a processing station and processing the semiconductor wafers at the processing station while the semiconductor wafers are loaded into the semiconductor wafer carrier and horizontally bowed.

19 Claims, 5 Drawing Sheets

(58) Field of Classification Search
USPC ....... 211/41.18, 43; 206/833, 711, 710, 832, 206/454; 414/935–941; 269/266, 903, 269/289 R
See application file for complete search history.

(56) References Cited

U.S. PATENT DOCUMENTS

| | | | | |
|---|---|---|---|---|
| 4,388,140 A * | 6/1983 | Nakazato | ........... | H01L 21/67086 156/345.23 |
| 4,471,716 A | 9/1984 | Milliren | | |
| 4,515,104 A * | 5/1985 | Lee | ........... | B05C 13/02 118/500 |
| 4,566,839 A | 1/1986 | Butler | | |
| 4,572,101 A * | 2/1986 | Lee | ........... | B05C 13/02 118/500 |
| 4,573,851 A * | 3/1986 | Butler | ........... | H01L 21/67313 206/832 |
| 4,872,554 A * | 10/1989 | Quernemoen | ........... | C30B 31/10 118/500 |
| 4,981,222 A * | 1/1991 | Lee | ........... | C23C 16/4587 118/500 |
| 4,993,559 A * | 2/1991 | Cota | ........... | H01L 21/67313 211/41.18 |
| 5,117,984 A * | 6/1992 | Kennedy | ........... | G11B 33/0483 211/40 |
| 5,461,774 A * | 10/1995 | Holmes | ........... | H01L 21/4878 174/16.3 |
| 5,503,173 A * | 4/1996 | Kudo | ........... | H01L 21/67057 134/201 |
| 5,657,879 A * | 8/1997 | Anderson | ........... | H01L 21/67313 211/41.18 |
| 5,788,304 A * | 8/1998 | Korn | ........... | H01L 21/67316 118/500 |
| 5,908,042 A * | 6/1999 | Fukunaga | ........... | B08B 11/02 134/25.1 |
| 6,089,377 A * | 7/2000 | Shimizu | ........... | H01L 21/67313 118/500 |
| 6,308,839 B1 * | 10/2001 | Steinberg | ........... | G11B 23/0236 211/184 |
| 6,384,487 B1 * | 5/2002 | Smith | ........... | H01L 21/565 257/666 |
| 6,561,796 B1 * | 5/2003 | Barrera | ........... | C23C 16/46 118/50 |
| 6,648,150 B2 * | 11/2003 | Hartstone | ........... | G11B 33/0461 211/11 |
| 7,868,467 B2 * | 1/2011 | Lee | ........... | H01L 21/823412 257/780 |
| 8,221,600 B2 | 3/2012 | Ganti | | |
| 8,221,601 B2 | 7/2012 | Chen et al. | | |
| 8,317,987 B2 | 11/2012 | Abas et al. | | |
| 8,322,300 B2 | 12/2012 | Pavani et al. | | |
| 8,449,238 B2 | 5/2013 | Mulligan et al. | | |
| 8,557,093 B2 | 10/2013 | Cousins et al. | | |
| 9,048,245 B2 * | 6/2015 | Blackshear | ........... | H01L 23/562 |
| 9,059,240 B2 * | 6/2015 | Blackshear | ........... | H01L 24/75 |
| 9,465,049 B2 * | 10/2016 | Colvin | ........... | G01R 1/44 |
| 9,556,512 B2 | 1/2017 | Cousins et al. | | |
| 9,824,894 B2 * | 11/2017 | deVilliers | ........... | H01L 21/2658 |
| 2003/0056391 A1 * | 3/2003 | Shikami | ........... | H01L 21/67034 34/92 |
| 2004/0137737 A1 * | 7/2004 | Seo | ........... | H01L 21/2815 438/690 |
| 2004/0163988 A1 | 8/2004 | Yamada et al. | | |
| 2004/0219780 A1 * | 11/2004 | Ohuchi | ........... | H01L 21/3085 438/637 |
| 2004/0226506 A1 * | 11/2004 | Lynn | ........... | H01L 21/67057 118/500 |
| 2004/0262245 A1 * | 12/2004 | Niese | ........... | H01L 21/67313 211/41.18 |
| 2005/0051083 A1 * | 3/2005 | Ruiz | ........... | H01L 21/67316 118/58 |
| 2005/0189616 A1 * | 9/2005 | Brennan | ........... | H01L 29/0657 257/550 |
| 2006/0286769 A1 | 12/2006 | Tsuchiya et al. | | |
| 2007/0034252 A1 * | 2/2007 | Pellegrin | ........... | H01L 21/6734 136/256 |
| 2007/0123031 A1 * | 5/2007 | Isogai | ........... | H01L 28/91 438/624 |
| 2007/0125726 A1 * | 6/2007 | Seo | ........... | H01L 21/67028 211/41.18 |
| 2009/0084169 A1 * | 4/2009 | Bailey, III | ........... | H01L 22/20 73/104 |
| 2010/0078867 A1 * | 4/2010 | Nakashima | ........... | H01L 21/67057 269/303 |
| 2011/0062053 A1 * | 3/2011 | Vo | ........... | H01L 21/67313 206/722 |
| 2011/0064953 A1 * | 3/2011 | O'Rourke | ........... | H01L 29/78603 428/414 |
| 2011/0100937 A1 | 5/2011 | Mohamed | | |
| 2012/0021552 A1 * | 1/2012 | Alexander | ........... | H01L 21/67109 438/57 |
| 2012/0074523 A1 * | 3/2012 | Goldstein | ........... | C30L 323/025 257/607 |
| 2012/0225554 A1 * | 9/2012 | Yoon | ........... | H01L 21/76802 438/675 |
| 2014/0045411 A1 * | 2/2014 | Senderzon | ........... | H01L 21/67092 451/41 |
| 2014/0209666 A1 * | 7/2014 | Interrante | ........... | H01L 24/75 228/180.1 |
| 2014/0225231 A1 * | 8/2014 | Gambino | ........... | H01L 23/562 257/629 |
| 2014/0379282 A1 * | 12/2014 | Inaba | ........... | G01N 23/20 702/42 |
| 2015/0056805 A1 * | 2/2015 | Park | ........... | H01L 21/76804 438/672 |
| 2015/0137259 A1 * | 5/2015 | Han | ........... | H01L 29/4175 257/384 |
| 2015/0155196 A1 | 6/2015 | Wu et al. | | |
| 2015/0294917 A1 * | 10/2015 | deVilliers | ........... | H01L 22/20 438/7 |
| 2015/0371909 A1 * | 12/2015 | Bhagavat | ........... | H01L 22/12 438/5 |
| 2016/0315003 A1 * | 10/2016 | Reichart | ........... | H01L 21/67313 |
| 2016/0322253 A1 * | 11/2016 | Yen | ........... | H01L 21/67313 |

* cited by examiner

BOWING SEMICONDUCTOR WAFERS

TECHNICAL FIELD

The subject matter described in this specification relates generally to manufacturing solar cells and other semiconductor structures by bowing semiconductor wafers.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit. Manufacturing solar cells and other semiconductor structures typically involves loading semiconductor wafers into a wafer carrier for one or more of various semiconductor processing stages.

DETAILED DESCRIPTION

This specification describes methods for processing semiconductor wafers, methods for loading semiconductor wafers into wafer carriers, and semiconductor wafer carriers. The methods and wafer carriers can be used for increasing the rigidity of wafers, e.g., large and thin wafers, by intentionally bowing the wafers to an extent that does not break the wafers. The wafers can be bowed after loading, i.e., within the wafer carrier, or prior to loading, i.e., so that the wafers are loaded so that the remain bowed when loaded. In some examples, the wafers are partially loaded, then bowed, and then fully inserted. In some examples, a method for processing semiconductor wafers includes loading each semiconductor wafer into a respective semiconductor wafer slot of a semiconductor wafer carrier, horizontally bowing each semiconductor wafer, and moving the semiconductor wafer carrier into a processing station and processing the semiconductor wafers at the processing station while the semiconductor wafers are loaded into the semiconductor wafer carrier and horizontally bowed.

Figure 1A:
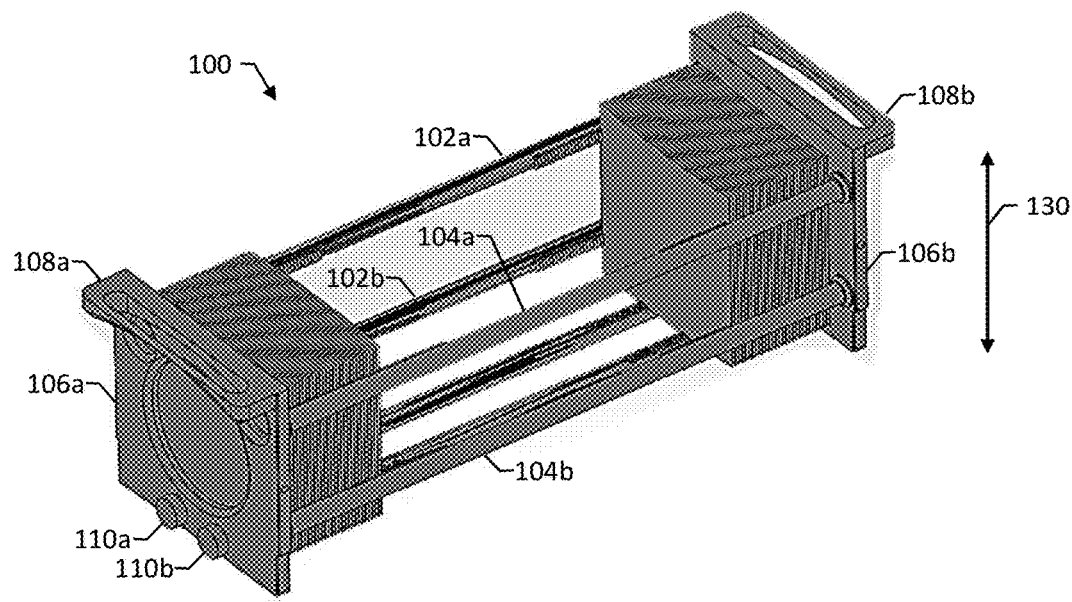
FIGS. 1A-B illustrate an example semiconductor wafer carrier.
Figure 1B:
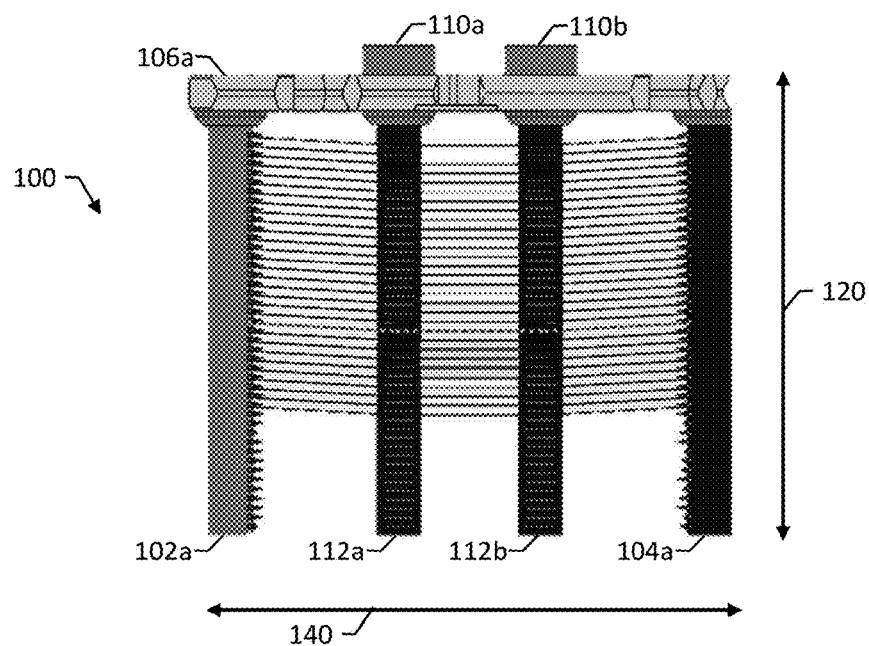

FIGS. 1A-B illustrate an example semiconductor wafer carrier 100. FIG. 1A shows an isometric view of the wafer carrier. FIG. 1B shows a top view of a portion of the wafer carrier 100.

The wafer carrier 100 includes upper and lower left-side rods 102a-b that are parallel in a vertical direction 130. The upper and lower left-side rods 102a-b each have a number of left-side notches. The left-side notches of the upper left-side rod 102a are vertically aligned with the left-side notches of the lower left-side rod 102b. The wafer carrier 100 also includes upper and lower right-side rods 104a-b that are parallel in the vertical direction 130 and have right-side notches that mirror the left-side notches.

Although the wafer carrier 100 is illustrated with upper and lower side rods, in some examples, the wafer carrier 100 has only a single left-side rod and a single right-side rod. Similarly, in some examples, the wafer carrier 100 has more than two side rods on each side that are parallel in the vertical direction 130.

The wafer carrier 100 includes left and right bottom rods 112a-b. Although two bottom rods are illustrated, the wafer carrier 100 can be implemented using only one bottom rod or more than two bottom rods. The left and right bottom rods 112a-b each have a number of bottom notches. The upper and lower left-side rods 102a-b, the upper and lower right-side rods 104a-b, and the bottom rods 112a-b are joined so that the left-side notches face the right-side notches and are horizontally aligned with the bottom-side notches. The notches define a number of semiconductor wafer slots between horizontally-aligned left-side notches, right-side notches, and bottom notches.

For example, each of the semiconductor wafer slots can have a height between the upper left-side and upper right-side rods 102a and 104a and the bottom rods 112a-b sized to receive a standard-conforming polycrystalline solar wafer, for example, a 5 inch or 6 inch wafer (e.g., having a diagonal width across the face of the wafer of 5 inches or 6 inches). Each of the semiconductor wafer slots can have a lateral length between the upper and lower left-side rods 102a-b and the upper and lower right-side rods 104a-b sized to receive the standard-conforming polycrystalline solar wafer.

The upper and lower left-side rods 102a-b, the upper and lower right-side rods 104a-b, and the bottom rods 112a-b may be formed of any appropriate material. Typically, the material is nonreactive to one or more semiconductor manufacturing processes, e.g., chemical processes. For example, the upper and lower left-side rods 102a-b, the upper and lower right-side rods 106a-b, and the bottom rods 112a-b may be formed of quartz or silicon carbide.

In some examples, the wafer carrier 100 includes front and back plates 106a-b. Each of the front and back plates 106a-b extends laterally (in a lateral direction 140) between the upper and lower left-side rods 102a-b and the upper and lower right-side rods 104a-b. The upper and lower left-side rods 102a-b and the upper and lower right-side rods 104a-b and the bottom rods 112a-b are joined by the front and back plates 120a-b to extend horizontally from the front plate 106a to the back plate 106b. The bottom rods 112a-b can be joined to the front and back plates 106a-b at respective hermetically-sealed moving joints.

The wafer carrier includes a mechanical rod-slider 110a-b coupled to the bottom rods 112a-b. The mechanical rod-slider is configured for sliding, in a horizontal direction 120, the bottom rods 112a-b relative to the left and right rods 102a-b and 104a-b. Since the semiconductor wafers are engaged with the notches on the left and right rods 102a-b and 104a-b, the sliding of the bottom rods 112a-b causes horizontal bowing of the semiconductor wafers loaded into the semiconductor wafer slots.

For example, the mechanical rod-slider 110a-b can be a rotatable knob coupled to a leadscrew. In another example, the mechanical rod-slider 110a-b can be a push-and-pull knob coupled to a linear motion stage, or an electrically-controlled linear actuator. If the wafer carrier 100 has more than one bottom rod, the mechanical rod-slider 110a-b can be configured to move all the rods together so that the wafer bows uniformly.

Bowing the wafers can be useful, e.g., to allow high density wafer loading even with wafers that are large and thin. Bowing the wafers can, in some cases, increase the throughput of some processing steps without increasing a physical foot print. In some examples, process parameters such as nozzle pressure and pump flowrate can be adjusted or increased without breaking wafers since the wafers are bowed. Bowing the wafers can reduce or eliminate cross-slotting and improve uniformity by improving position control.

In some examples, the wafer carrier 100 includes front and back transport interface handles 108a-b. The transport interface handles 108a-b can be detachably coupled to the front and back plates 106a-b. The transport interface handles 108a-b can used, e.g., so that an automation system can lift and move the wafer carrier 100.

Figure 2A:
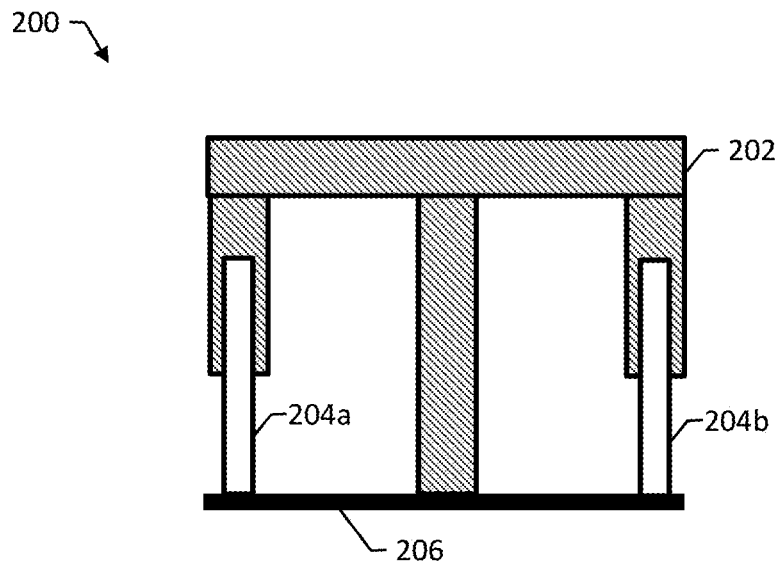
FIGS. 2A-B illustrate a portion of an example automation system for bowing semiconductor wafers prior to loading the wafers into a wafer carrier.
Figure 2B:
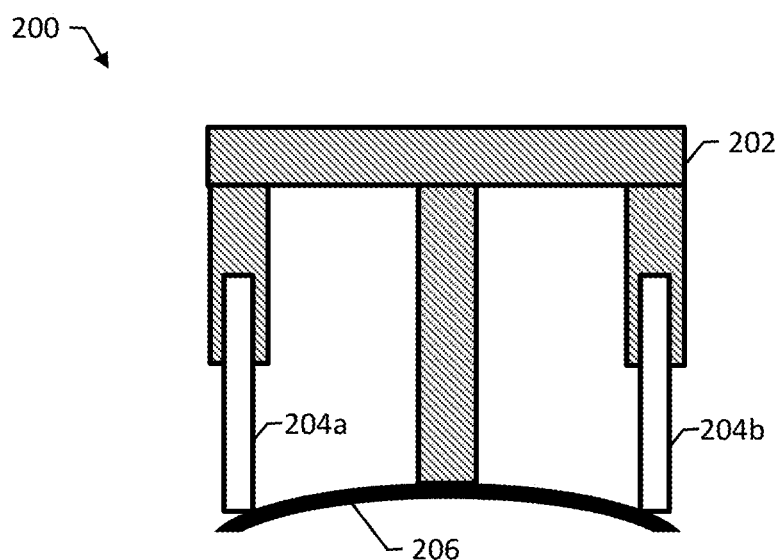

FIGS. 2A-B illustrate a portion of an example automation system 200 for bowing semiconductor wafers prior to loading the wafers into a wafer carrier. The automation system 200 is implemented using robotic components and can be controlled, e.g., by a computer system programmed for loading and processing semiconductor wafers. In general, any appropriate robotic system can be used for bowing the wafers, and the automation system 200 shown in FIGS. 2A-B is provided for purposes of illustration.

The automation system 200 includes a robotic gripper 202 having left and right pistons 204a-b. The robotic gripper 202 is configured to grip a semiconductor wafer 206 and hold the center of the wafer 206 in place. The left and right pistons 204a-b are configured to engage the left and right sides of the wafer 206 and push the wafer 206 to bow without breaking the wafer 206. FIG. 2A shows the robotic gripper 202 holding the wafer 206 prior to bowing the wafer 206. FIG. 2B shows the pistons 204a-b causing the wafer 206 to horizontally bow.

Figure 3A:
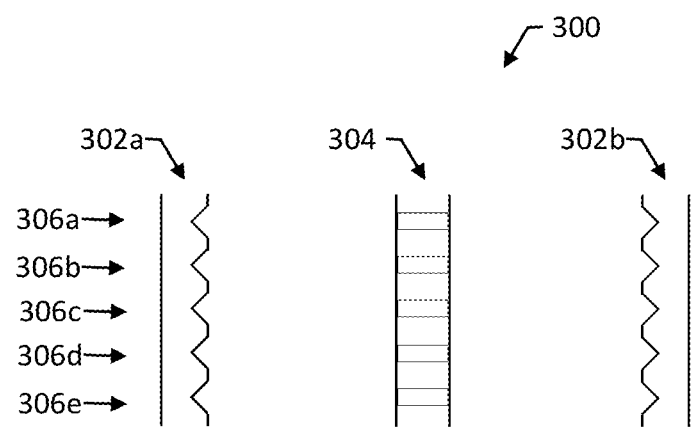
FIGS. 3A-F illustrate loading of a horizontally-bowed semiconductor wafer into an example wafer carrier.
Figure 3B:
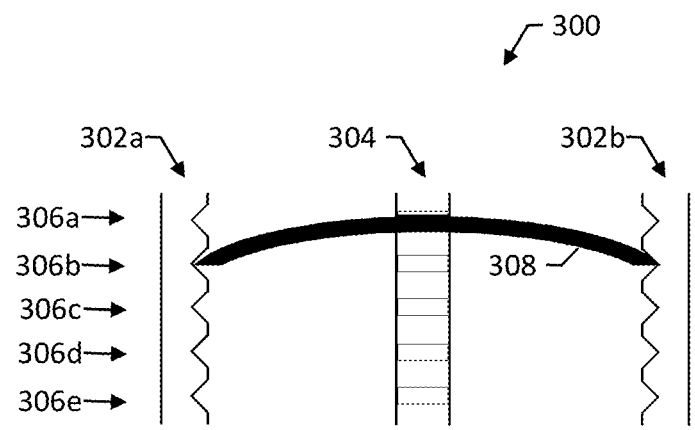
Figure 3C:
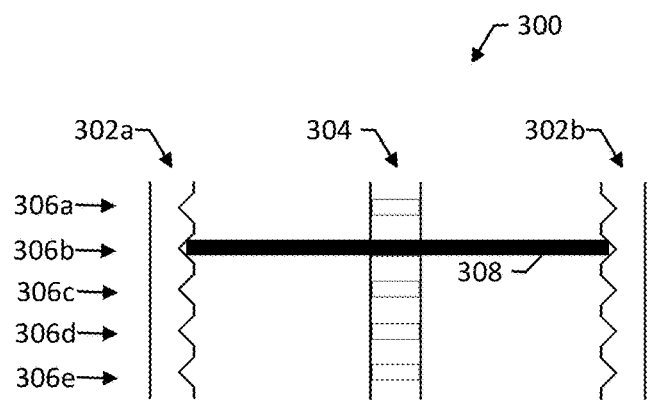
Figure 3D:
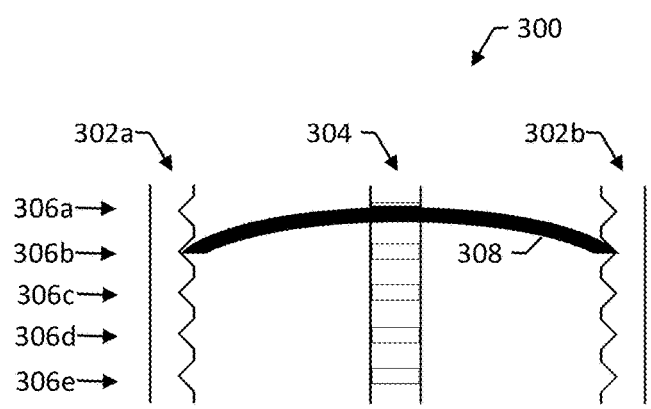

FIGS. 3A-F illustrate loading of a horizontally-bowed semiconductor wafer 308 into an example wafer carrier 300. The wafer carrier 300 includes a left-side rod 302a, a right-side rod 302b, and a bottom rod 304. FIGS. 3A-B illustrate pre-bowing the semiconductor wafer 308 prior to loading, and FIGS. 3C-D illustrate partially loading the semiconductor wafer 308 before bowing the semiconductor wafer 308 and then fully loading the horizontally-bowed semiconductor wafer 308.

FIG. 3A is a top view of the wafer carrier 300 prior to loading of the horizontally-bowed wafer 308 shown in FIG. 3B. The illustrated portion of the wafer carrier 300 has five wafer slots 306a-e each comprising horizontally aligned notches in the left and right rods 302a-b and the bottom rod 304.

FIG. 3B is a top view of the wafer carrier 300 after loading the horizontally-bowed wafer 308. Since the wafer 308 is bowed, the center of the wafer 308 engages the bottom rod 304 in the first wafer slot 306a and the right and left sides of the wafer 308 engage the right and left rods 302a-b in the second wafer slot 306b. For example, the left and right sides of the wafer 308 may be horizontally offset from the center of the wafer 308 by a horizontal distance of about 8 mm, or any appropriate distance that increases the rigidity of the wafer 308 without breaking the wafer 308.

Accordingly, the bottom notch is horizontally offset from the left and right notches, and the wafer carrier 300 keeps the wafer 308 horizontally bowed after the wafer 308 has been bowed and loaded by an automation system such as the example automation system 200 of FIGS. 2A-B. As illustrated, the bottom notch is only offset by one position; however, depending on the distance that the wafer is bowed, the bottom notch may be offset by more than one position from the left and right notches.

Figures 3E, 3F:
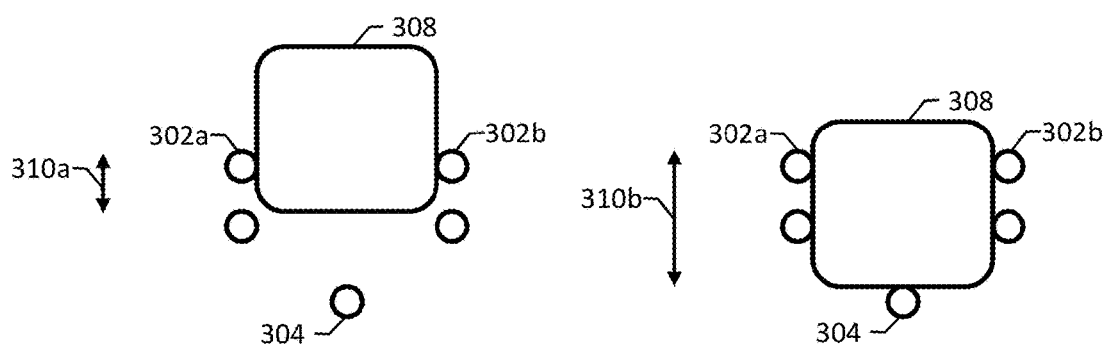

FIG. 3C is a top view of the wafer carrier 300 where the wafer 308 has been partially inserted. The wafer 308 has been inserted in the wafer carrier 300 to a first depth so that the right and left sides of the wafer 308 engage the right and left rods 302a-b in the second wafer slot 306b, but the bottom of the wafer 308 has not yet engaged the bottom rod 304. FIG. 3E is a front view of the wafer carrier 300 where the wafer 308 has been partially inserted to the first depth 310a.

FIG. 3D is a top view of the wafer carrier 300 after the wafer 308 has been horizontally bowed and fully inserted to a second depth, deeper than the first depth, so that the bottom of the wafer 308 engages the bottom rod 304 in a bottom notch horizontally offset from the second wafer slot 306b, i.e., the bottom notch for the first wafer slot 306a. FIG. 3F is a front view of the wafer carrier 300 where the wafer 308 has been fully inserted to the second depth 310b.

Figure 4:
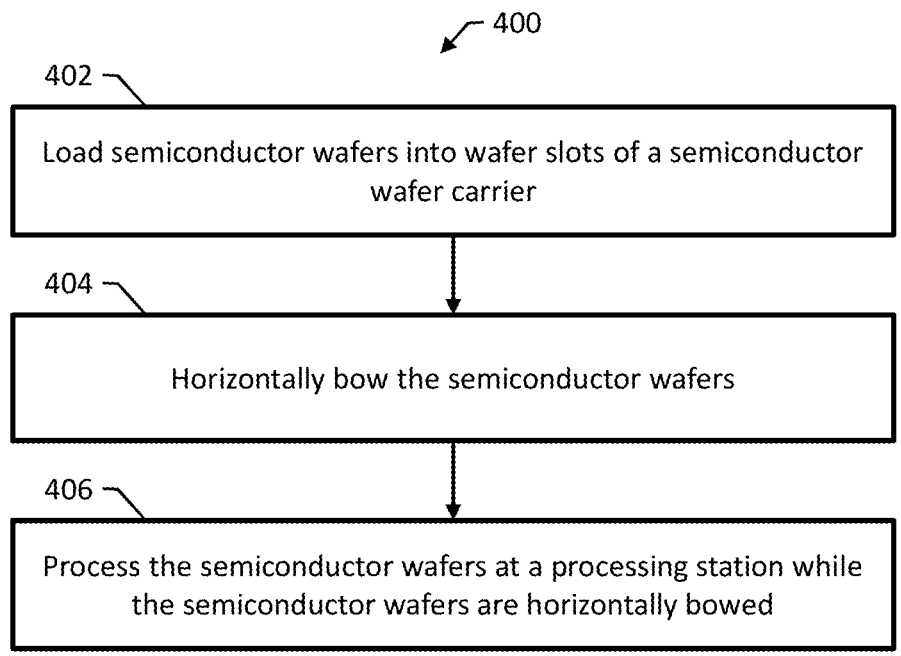
FIG. 4 is a flow diagram of an example method for processing semiconductor wafers.

FIG. 4 is a flow diagram of an example method 400 for processing semiconductor wafers. The method 400 can be performed, e.g., by an automation system for processing semiconductor wafers, or by an automation system acting together with one or more human operators.

The method 400 includes loading each semiconductor wafer into a respective semiconductor wafer slot of a semiconductor wafer carrier (402). The wafer carrier can be, e.g., the wafer carrier 100 of FIGS. 1A and 1B. The method 400 includes horizontally bowing each semiconductor wafer (404). For example, horizontally bowing the wafers can include sliding, in the horizontal direction, one or more bottom rods relative to the left and right rods. The method 400 includes moving the semiconductor wafer carrier into a processing station and processing the semiconductor wafers at the processing station while the semiconductor wafers are loaded into the semiconductor wafer carrier and horizontally bowed (406).

Figure 5:
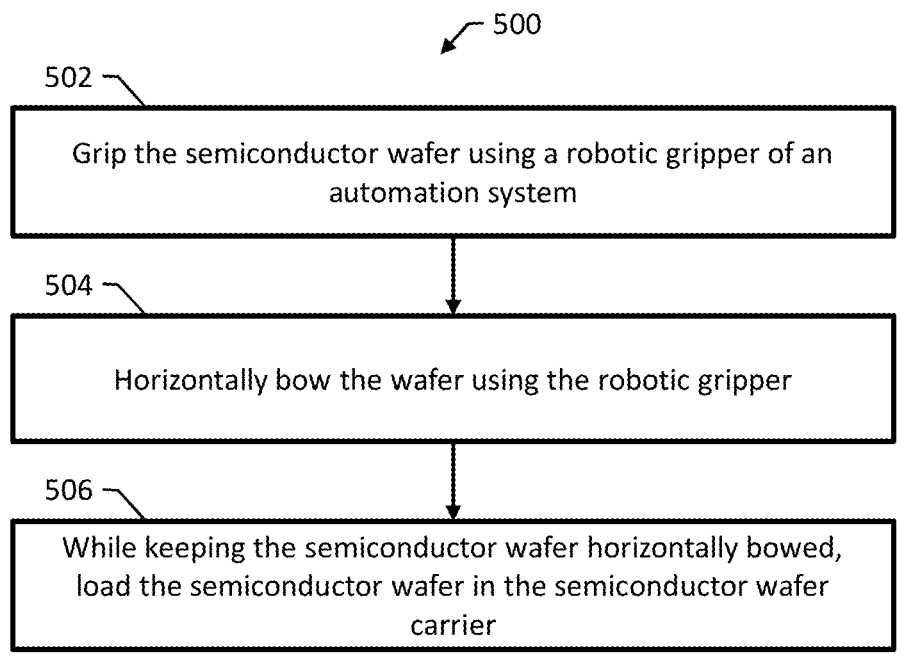
FIG. 5 is a flow diagram of an example method for loading semiconductor wafers into a semiconductor wafer carrier.

FIG. 5 is a flow diagram of an example method 500 for loading semiconductor wafers into a semiconductor wafer carrier. The method 500 can be performed, e.g., by an automation system for processing semiconductor wafers, or by an automation system acting together with one or more human operators. The wafer carrier can be, e.g., the wafer carrier 300 of FIGS. 3A-B.

The method 500 includes, for each wafer, gripping the wafer using a robotic gripper of an automation system (502). For example, the automation system can be the automation system 200 of FIGS. 2A-B. The method 500 includes, for each wafer, horizontally bowing the wafer using gripper (504). The method 500 includes, for each wafer and while keeping the wafer horizontally bowed, loading the wafer in the semiconductor wafer carrier (506). The wafer sits in horizontally aligned left and right notches in left and right rods of the semiconductor wafer carrier. Due to the horizontal bowing, the wafer sits in at least one bottom notch in a bottom rod that is horizontally offset from the left and right notches in the left and right rods.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A method for processing semiconductor wafers, the method comprising:
   providing a plurality of semiconductor wafers;
   loading each semiconductor wafer of the plurality of semiconductor wafers into a respective semiconductor wafer slot of a semiconductor wafer carrier, the semiconductor wafer carrier comprising:
      left and right rods extending in a horizontal direction, the left rod comprising a plurality of left-side notches and the right rod comprising a plurality of right-side notches; and
      one or more bottom rods extending in the horizontal direction, each of the one or more bottom rods comprising a plurality of bottom notches, wherein the one or more bottom rods are joined to the left and right rods so that the left-side notches face the right-side notches and the bottom notches face vertically upwards into a space between the left-side notches and the right-side notches, defining the plurality of semiconductor wafer slots between the left-side notches, the right-side notches, and the bottom notches;
   horizontally bowing each semiconductor wafer of the plurality of semiconductor wafers loaded into the semiconductor wafer slots; and
   moving the semiconductor wafer carrier into a processing station and processing the semiconductor wafers at the processing station while the semiconductor wafers are loaded into the semiconductor wafer carrier and horizontally bowed.

2. The method of claim 1, wherein horizontally bowing each semiconductor wafer of the plurality of semiconductor wafers loaded into the semiconductor wafer slots comprises sliding, in the horizontal direction, the one or more bottom rods relative to the left and right rods.

3. The method of claim 2, wherein sliding the one or more bottom rods relative to the left and right rods comprises one or more of: rotating a rotatable knob coupled to a leadscrew coupled to the one or more bottom rods; pushing or pulling on a push-and-pull knob coupled to a linear motion stage coupled to the one or more bottom rods; and activating an electrically-controlled linear actuator coupled to the one or more bottom rods.

4. The method of claim 1, wherein loading each semiconductor wafer of a plurality of semiconductor wafers into a respective semiconductor wafer slot comprises loading each semiconductor wafer into a respective semiconductor wafer slot between front and back plates each extending laterally between the left and right rods.

5. The method of claim 4, wherein moving the semiconductor wafer carrier into a processing station comprises attaching front and back transport interface handles to the front and back plates and lifting the semiconductor wafer carrier by the front and back transport interface handles.

6. A method for loading a plurality of semiconductor wafers into a semiconductor wafer carrier, the method comprising, for each semiconductor wafer:
   gripping the semiconductor wafer using a robotic gripper of an automation system;
   horizontally bowing the semiconductor wafer using the robotic gripper; and
   loading the semiconductor wafer in the semiconductor wafer carrier so that the semiconductor wafer sits in horizontally aligned left and right notches in left and right rods of the semiconductor wafer carrier, and so that the semiconductor wafer sits in at least one bottom notch in a bottom rod that is horizontally offset from the left and right notches in the left and right rods,
   wherein loading the semiconductor wafer comprises loading the semiconductor wafer between front and back plates of the semiconductor wafer carrier each extending laterally between the left and right rods, and wherein the left and right rods are fixed to the front and back plates and extend horizontally from the front plate to the back plate, and wherein the bottom rod is fixed to the front and back plates and extends horizontally from the front plate to the back plate at a lower vertical height than the left and right rods.

7. The method of claim 6, wherein:
   loading the semiconductor wafer comprises inserting the semiconductor wafer to a first depth in the semiconductor wafer carrier so that the semiconductor wafer engages the horizontally aligned left and right notches;
   horizontally bowing the semiconductor wafer comprises horizontally bowing the semiconductor after inserting the semiconductor wafer to the first depth; and
   loading the semiconductor wafer comprises, after horizontally bowing the semiconductor wafer, further inserting the semiconductor wafer to a second depth in the semiconductor wafer carrier so that the semiconductor wafer engages the at least one bottom notch.

8. The method of claim 7, wherein horizontally bowing the semiconductor wafer comprises horizontally bowing the semiconductor wafer prior to loading the semiconductor wafer into the semiconductor wafer carrier.

9. The method of claim 6, comprising attaching front and back transport interface handles to the front and back plates.

10. A semiconductor wafer carrier comprising:
   left and right rods extending in a horizontal direction, the left rod comprising a plurality of left-side notches and the right rod comprising a plurality of right-side notches;
   one or more bottom rods extending in the horizontal direction, each of the one or more bottom rods comprising a plurality of bottom notches, wherein the one or more bottom rods are joined to the left and right rods so that the left-side notches face the right-side notches and the bottom notches face vertically upwards into a space between the left-side notches and the right-side notches, defining a plurality of semiconductor wafer slots between the left-side notches, the right-side notches, and the bottom notches; and a mechanical rod-slider coupled to the one or more bottom rods, the mechanical rod-slider comprising a leadscrew configured for sliding, in the horizontal direction, the one or more bottom rods relative to the left and right rods, for horizontally bowing a plurality of semiconductor wafers loaded into the semiconductor wafer slots.

11. The semiconductor wafer carrier of claim 10, wherein the mechanical rod-slider comprises a rotatable knob coupled to the leadscrew.

12. The semiconductor wafer carrier of claim 10, wherein the mechanical rod-slider comprises a push-and-pull knob coupled to a linear motion stage.

13. The semiconductor wafer carrier of claim 10, wherein the mechanical rod-slider comprises an electrically-controlled linear actuator.

14. The semiconductor wafer carrier of claim 10, comprising front and back plates each extending laterally between the left and right rods.

15. The semiconductor wafer carrier of claim 14, comprising front and back transport interface handles detachably coupled to the front and back plates.

16. The semiconductor wafer carrier of claim 14, wherein the left and right rods are fixed to the front and back plates and extend horizontally from the front plate to the back plate.

17. The semiconductor wafer carrier of claim 14, wherein the one or more bottom rods are slidably joined to the front and back plates and extend horizontally from the front plate to the back plate at a lower vertical height than the left and right rods.

18. The semiconductor wafer carrier of claim 14, wherein each of the one or more bottom rods is joined to the front and back plates at a respective hermetically-sealed moving joint.

19. The semiconductor wafer carrier of claim 10, wherein each of the plurality of semiconductor wafer slots is sized to receive a polycrystalline solar wafer having at least one dimension of five or six inches or longer.

* * * * *